United States Patent
Kawachi et al.

(10) Patent No.: US 7,002,438 B2
(45) Date of Patent: Feb. 21, 2006

(54) SURFACE ACOUSTIC WAVE DEVICE WITH REFLECTION ELECTRODES HAVING PITCHES THAT VARY

(75) Inventors: Osamu Kawachi, Yokohama (JP); Satoshi Orito, Yokohama (JP); Takuya Abe, Sagamihara (JP)

(73) Assignee: Fujitsu Media Devices Limited, Yokohama (JP)

( * ) Notice: Subject to any disclaimer, the term of this patent is extended or adjusted under 35 U.S.C. 154(b) by 0 days.

(21) Appl. No.: 10/925,152

(22) Filed: Aug. 25, 2004

(65) Prior Publication Data

US 2005/0035831 A1     Feb. 17, 2005

Related U.S. Application Data

(63) Continuation of application No. PCT/JP03/01166, filed on Feb. 5, 2003.

(30) Foreign Application Priority Data

Feb. 27, 2002    (JP)    .............................. 2002-052460

(51) Int. Cl.
    *H03H 9/64*    (2006.01)
(52) U.S. Cl. .................................. 333/195; 310/313 D
(58) Field of Classification Search ........ 333/193–196, 333/133; 310/313 B, 313 D
See application file for complete search history.

(56) References Cited

U.S. PATENT DOCUMENTS

| 5,760,664 A  * | 6/1998 | Allen .......................... 333/194 |
| 6,359,368 B1 * | 3/2002 | Tsutsumi et al. ........ 310/313 D |
| 6,420,946 B1 * | 7/2002 | Bauer et al. ................. 333/193 |
| 6,894,588 B1 * | 5/2005 | Detlefsen .................... 333/195 |

FOREIGN PATENT DOCUMENTS

| DE | 41 26 335 A1 | * 2/1993 | ................. 333/195 |
| JP | 62-199111 | * 9/1987 | ................. 333/187 |
| JP | 2-172312 | * 7/1990 | |
| JP | 7-135444 | 5/1995 | |
| JP | 8-125489 | 5/1996 | |
| JP | 8-191229 | 7/1996 | |
| JP | 10-32462 | * 2/1998 | |
| JP | 10-51259 | 2/1998 | |
| JP | 11-317643 | 11/1999 | |
| JP | 2000-224003 | 8/2000 | |
| JP | 2000-312133 | * 11/2000 | |
| JP | 2001-257556 | 9/2001 | |
| JP | 2001-332954 | * 11/2001 | |
| JP | 2003-188674 | * 7/2003 | |

* cited by examiner

*Primary Examiner*—Barbara Summons
(74) *Attorney, Agent, or Firm*—Arent Fox PLLC (57) ABSTRACT

A surface acoustic wave device includes: a substrate; a pair of reflection electrodes that are formed on the substrate; and drive electrodes that are interposed between the reflection electrodes. In this surface acoustic wave device, the pitches in each of the reflection electrodes vary according to a predetermined variation pattern. With this structure, the suppression on spurious signals and the shape factor (the sharpness of the cut-off region of the pass band) can be improved at the same time.

24 Claims, 9 Drawing Sheets

SURFACE ACOUSTIC WAVE DEVICE WITH REFLECTION ELECTRODES HAVING PITCHES THAT VARY

This nonprovisional application is a continuation application of and claims the benefit of International Application Number PCT/JP03/01166, filed Feb. 5, 2003. The disclosure of the prior application is hereby incorporated herein in its entirety by reference.

FIELD OF THE INVENTION

The present invention relates to surface acoustic wave devices, and more particularly, to a multi-mode surface acoustic wave device.

In recent years, wireless devices such as portable telephone devices and cordless telephone devices have become small and light, and have rapidly spread. Filters are used in the high frequency circuits of those wireless devices, and play an important role in this development. Especially, surface acoustic wave devices are used as devices to form such filters. To date, various types of surface acoustic wave devices have been developed and put into practical use. Among those surface acoustic wave devices, multi-mode surface acoustic wave devices are considered to have an excellent degree of suppression on the low frequency side.

BACKGROUND OF THE INVENTION

Filters using such multi-mode surface acoustic wave devices are disclosed in Japanese Unexamined Patent Publication Nos. 2001-257556, 2000-224003, 11-317643, 10-51259, 8-191229, 8-125489, and 7-135444, for example.

Each of the multi-mode surface acoustic wave filters disclosed in those publications includes a substrate, a pair of reflection electrodes that are formed on the substrate, and drive electrodes that are interposed between the reflection electrodes. So as to improve the characteristics of those multi-mode surface acoustic wave filters, various techniques have been suggested. In the above publications, spurious signals that appear on the low frequency side and the high frequency side of the vicinities of the pass band are suppressed by improving the reflectors that form stop bands.

For example, Japanese Unexamined Patent Publication No. 2001-257556 discloses a structure in which three electrodes are provided for each wavelength of excited surface wave in each reflector so as to suppress spurious signals due to high-order longitudinal mode on the low frequency side of the pass band. Japanese Unexamined Patent Publication No. 2000-224003 discloses a structure in which the electrode pitches of one of the reflectors differ from the electrode pitches of the other one of the reflectors so as to suppress spurious signals that appear on the low frequency side of the pass band. Japanese Unexamined Patent Publication No. 11-317643 discloses a structure in which the electrode pitch of one of the reflectors differs from the electrode pitch of the other one of the reflectors so as to suppress spurious signals that appear on the low frequency side of the pass band. Further, Japanese Unexamined Patent Publication Nos. 10-51259, 8-191229, 8-125489, and 7-135444 disclose improvements based on the distance between a comb-like electrode and each reflector.

However, those publications do not disclose a technique for improving the suppression on spurious signals and the shape factor (the sharpness of the cut-off region of the pass band).

Therefore, the object of the present invention is to provide a surface acoustic wave device that simultaneously exhibits greater suppression on spurious signals and an improved shape factor (the sharpness of the cut-off region of the pass band) by a different method from any of the above conventional methods.

DISCLOSURE OF THE INVENTION

To achieve the above object, the present invention provides a surface acoustic wave device that includes: a substrate; a pair of reflection electrodes that are formed on the substrate; and drive electrodes that are interposed between the reflection electrodes. In this surface acoustic wave device, the pitches in each of the reflection electrodes vary according to a predetermined variation pattern. With this structure, the suppression on spurious signals and the shape factor (the sharpness of the cut-off region of the pass band) can be improved at the same time.

Another surface acoustic wave device of the present invention includes: a pair of reflection electrodes that are formed on a substrate; and drive electrodes that are interposed between the reflection electrodes. In this surface acoustic wave device, each of the reflection electrodes is divided into blocks, and at least two of the blocks have different pitches from each other. With this structure, the suppression on spurious signals and the shape factor (the sharpness of the cut-off region of the pass band) can be improved at the same time.

Yet another surface acoustic wave device of the present invention has longitudinally coupled multi-mode resonators, and each of the resonators includes: a pair of reflection electrodes that are formed on the same substrate; drive electrodes that are interposed between the reflection electrodes. In each of the resonators of this surface acoustic wave device, each of the reflection electrodes has pitches that vary according to a predetermined variation pattern. As surface acoustic wave devices are longitudinally coupled (cascade-connected), the suppression on spurious signals and the shape factor (the sharpness of the cut-off region of the pass band) can be improved at the same time.

DESCRIPTION OF THE PREFERRED EMBODIMENTS

The following is a description of embodiments of the present invention.

(First Embodiment)

Figure 1:
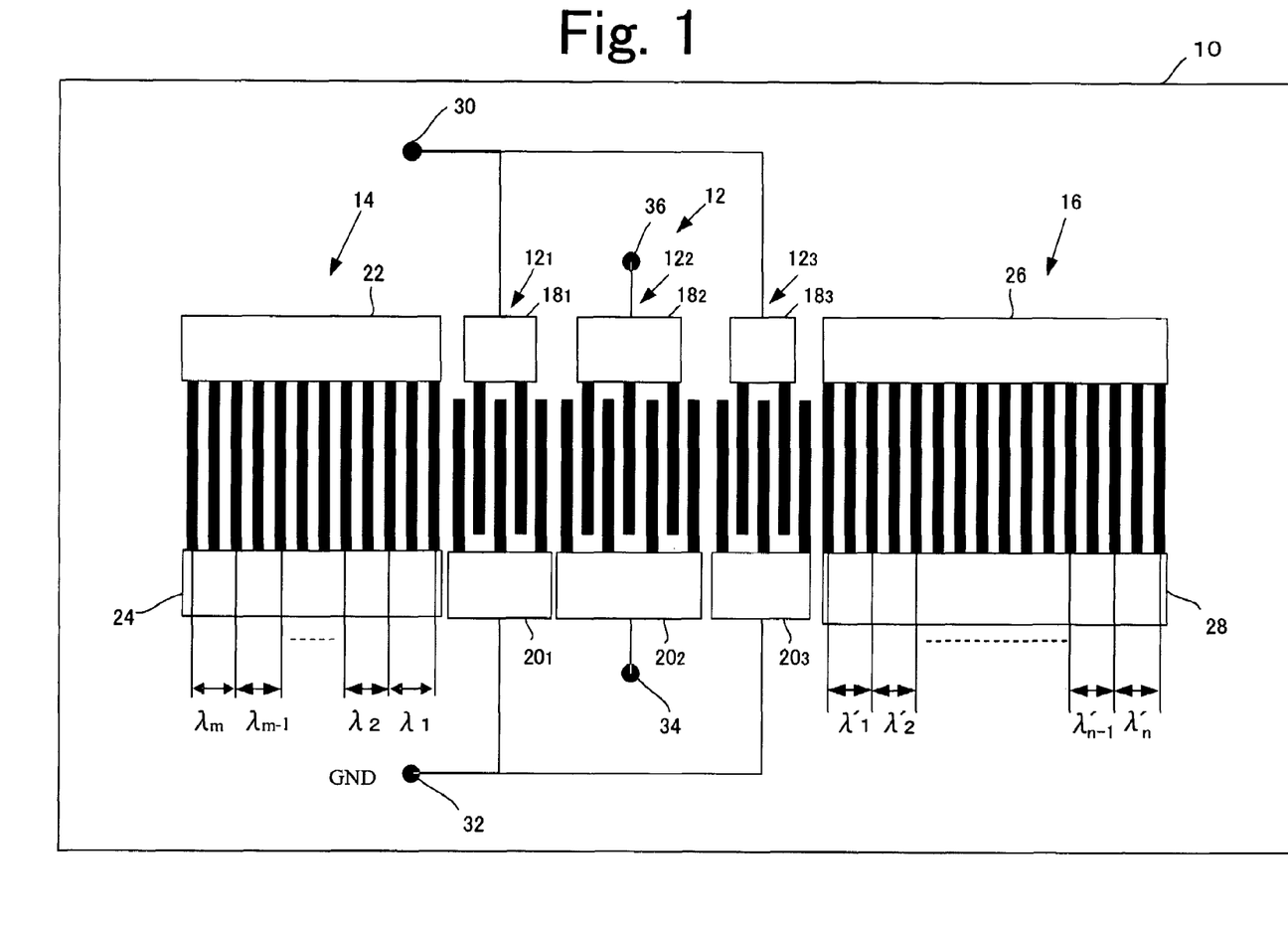
FIG. 1 illustrates a first embodiment of the present invention.

FIG. 1 illustrates a surface acoustic wave device in accordance with a first embodiment of the present invention. The surface acoustic wave device shown in FIG. 1 is a multi-mode (double-mode) surface acoustic wave device with the first-order (primary) mode and the third-order mode. This surface acoustic wave device includes a piezoelectric substrate 10, a drive electrode 12, and a pair of reflection electrodes 14 and 16. The drive electrode 12 and the reflection electrodes 14 and 16 are formed on the piezoelectric substrate 10. The piezoelectric substrate 10 is made of a piezoelectric material such as $LiTaO_3$ or $LiNbO_3$. The drive electrode 12 and the reflection electrodes 14 and 16 contain aluminum as a main component. The drive electrode 12 is interposed between the pair of reflection electrodes 14 and 16. The drive electrode 12 includes three electrodes $12_1$, $12_2$, and $12_3$. Those three electrodes $12_1$, $12_2$, and $12_3$ are so-called interdigital transducers. A bus bar $18_1$ of the electrode $12_1$ and a bus bar $18_3$ of the electrode $12_3$ are connected to an input (or output) terminal 30. A bus bar $20_1$ of the electrode $12_1$ and a bus bar $20_3$ of the electrode $12_3$ are connected to a ground terminal 32. A bus bar $18_2$ of the electrode $12_2$ is connected to a ground terminal 36, and a bus bar $20_2$ of the electrode $12_2$ is connected to an output (or input) terminal 34.

Figure 3:
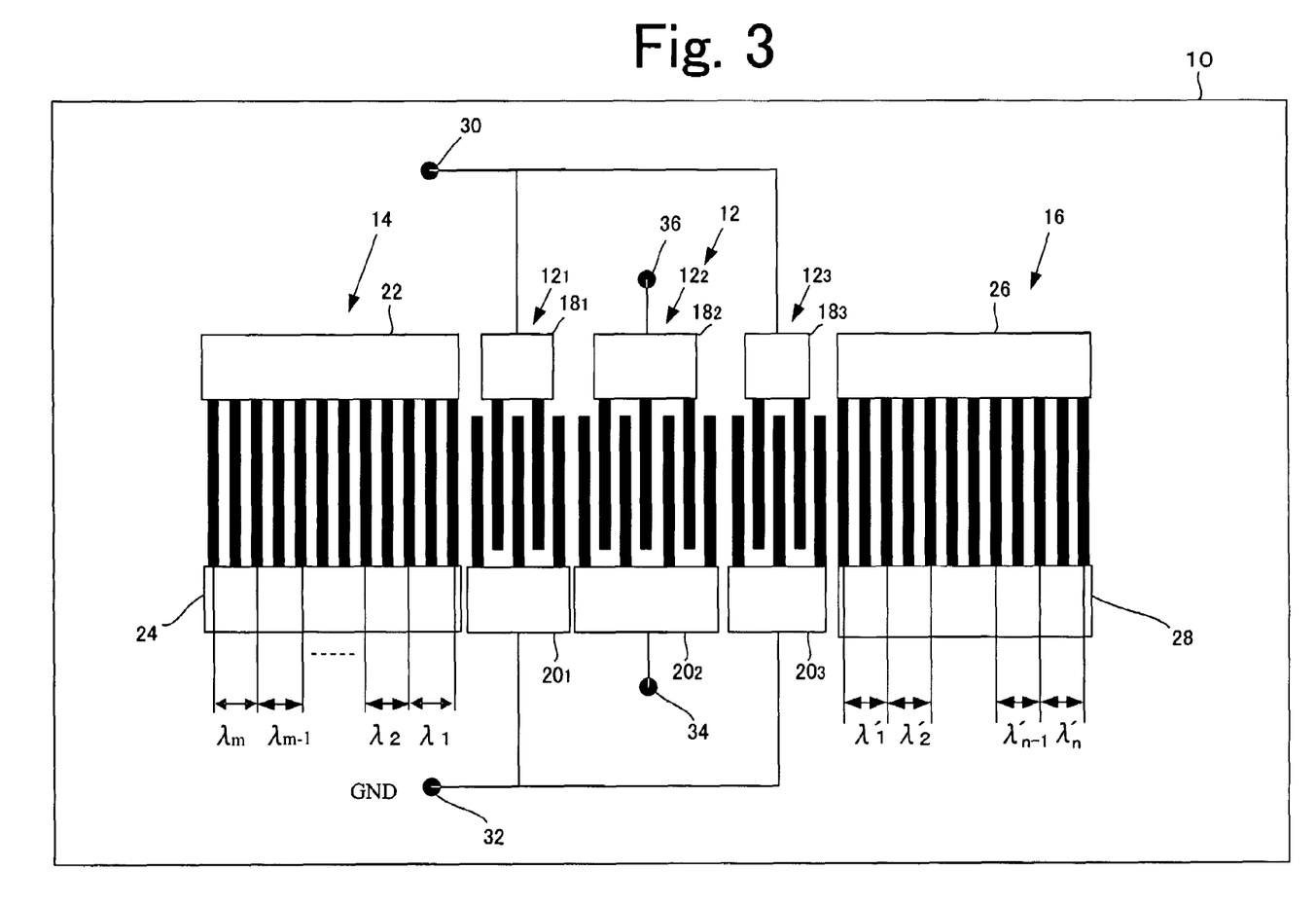
FIG. 3 illustrates another example structure of the first embodiment of the present invention.

The reflection electrode 14 is a grating reflection electrode, and has bus bars 22 and 24 formed on the opposite ends. Electrode fingers extend alternately from the bus bars 22 and 24. Unlike the drive electrode 12, the reflection electrode 14 has the electrode fingers each connected to the bus bar on the opposite end. Likewise, the reflection electrode 16 is also a grating reflection electrode that has bus bars 26 and 28 formed on the opposite ends. Electrode fingers extend alternately from the bus bars 26 and 28. In the example shown in FIG. 1, the number of electrode finger pairs of the reflection electrode 16 is greater than the number of electrode finger pairs of the reflection electrode 14. However, the number of electrode finger pairs of the reflection electrode 16 may be the same as the number of electrode finger pairs of the reflection electrode 14, as shown in FIG. 3. Here, the pitches (wavelength) of the reflection electrodes 14 and 16 are defined. As the electrode fingers extend alternately from the two bus bars as in the drive electrode 12, each pitch of the reflection electrodes 14 and 16 is defined as the distance between each two electrode fingers extending from the same bus bar. Accordingly, the pitches of the reflection electrode 14 are expressed as $\lambda 1, \lambda 2, \ldots, \lambda m-1$, and $\lambda m$, with m being a natural number. Likewise, the pitches of the reflection electrode 16 are expressed as $\lambda' 1, \lambda' 2, \ldots, \lambda' n-1$, and $\lambda' n$, with n being a natural number. In the example shown in FIG. 1, n is not equal to m, and is greater than m. However, n may be equal to m as in the case shown in FIG. 3.

Figure 2:
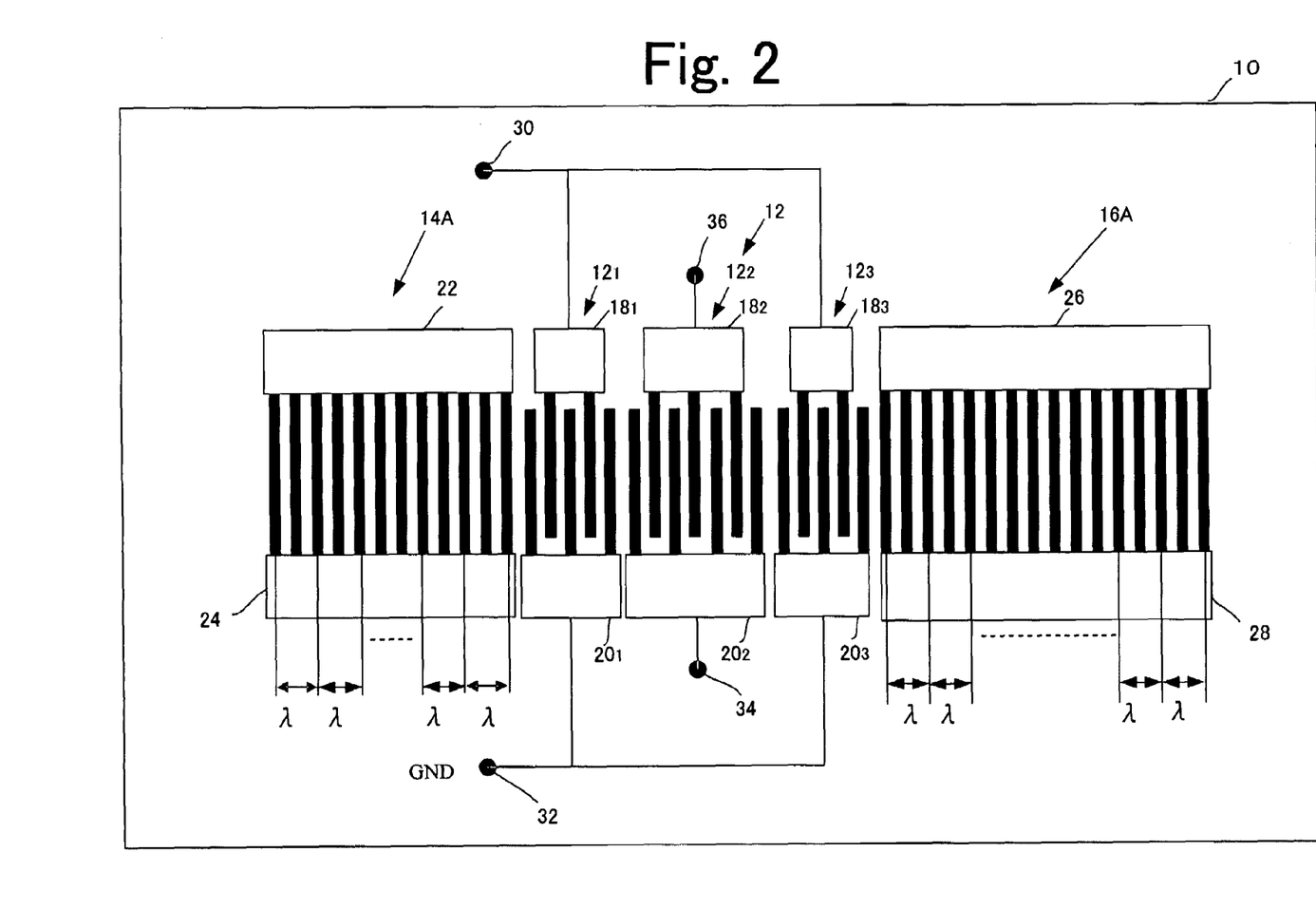
FIG. 2 illustrates a comparative example.

In general, the pitches of the reflection electrodes 14 and 16 are uniform as shown in FIG. 2. As the uniform pitches are represented by $\lambda$, the pitches of the reflection electrodes 14 and 16 are expressed as $\lambda = \lambda 1 = \lambda 2 = \ldots = \lambda m-1 = \lambda m = \lambda' 1 = \lambda' 2 = \ldots = \lambda' n-1 = \lambda' n$. In the first embodiment of the present invention, on the other hand, the pitches of the reflection electrodes 14 and 16 vary according to predetermined variation patterns. In the following, examples of the predetermined variation patterns are described.

The pitches $\lambda 1$ through $\lambda m$ of the reflection electrode 14 may continuously vary, and the pitches $\lambda' 1$ through $\lambda' n$ of the reflection electrode 16 may also continuously vary. For example, the pitches of the reflection electrode 14 may be expressed as $\lambda 1 < \lambda 2 < \ldots < \lambda m-1 < \lambda m$ while the pitches of the refection electrode 16 may be expressed as $\lambda' 1 < \lambda' 2 < \ldots < \lambda' n-1 < \lambda' n$. Alternatively, the pitches of the reflection electrode 14 may be expressed as $\lambda 1 > \lambda 2 > \ldots > \lambda m-1 > \lambda m$ while the pitches of the refection electrode 16 may be expressed as $\lambda' 1 > \lambda' 2 > \ldots > \lambda' n-1 > \lambda' n$. In either case, the pitches $\lambda 1$ through $\lambda m$ of the reflection electrode 14 and the pitches $\lambda' 1$ through $\lambda' n$ of the reflection electrode 16 may either linearly or non-linearly vary. In the case of linear variation, the pitches monotonously increase or monotonously decrease. The pitches may also increase halfway and then decrease. In the case of non-linear variation, the pitches curvilinearly vary. For example, the variation pattern of the pitches $\lambda 1$ through $\lambda m$ of the reflection electrode 14 and the variation pattern of the pitches $\lambda' 1$ through $\lambda' n$ of the reflection electrode 16 may be each represented by a sine curve, a cosine curve, or the like, or a quadratic curve.

Alternatively, the variation pattern of the pitches $\lambda 1$ through $\lambda m$ of the reflection electrode 14 and the variation pattern of the pitches $\lambda' 1$ through $\lambda' n$ of the reflection electrode 16 may each have a peak in the middle of each corresponding reflection electrode. For example, the pitch $\lambda i$ (i being a natural number other than 1 and m) of the reflection electrode 14 may be larger or smaller than the other pitches. Likewise, the pitch $\lambda' i$ (i being a natural number other than 1 and n) of the reflection electrode 16 may be larger or smaller than the other pitches. Further, the variation pattern of the reflection electrode 14 and the variation pattern of the reflection electrode 16 may be either symmetrical or asymmetrical with respect to the drive electrode 12. In the case of symmetrical variation, the pitches of the reflection electrode 14 are expressed as $\lambda 1 < \lambda 2 < \ldots < \lambda m$ while the pitches of the refection electrode 16 are expressed as $\lambda' 1 < \lambda' 2 < \ldots < \lambda' n$. If the number of electrode finger pairs of the reflection electrode 14 is different from the number of electrode finger pairs of the reflection electrode 16, the variation patterns cannot be completely symmetrical. However, as large as the tendency of variation is the same between the reflection electrodes 14 and 16, the variation patterns are considered to be symmetrical. If the pitches $\lambda 1$ through $\lambda m$ of the reflection electrode 14 and the pitches $\lambda' 1$ through $\lambda' n$ of the reflection electrode 16 exhibit quadratic curves, the variation patterns can be considered to be symmetrical with respect to the drive electrode 12, even though the shapes of the sine curves are different. Such variation patterns of the reflection electrodes 14 and 16 can be considered to be substantially symmetrical. In the case of asymmetrical variation, the pitches of the reflection electrode 14 are expressed as $\lambda 1 < \lambda 2 < \ldots < \lambda m$ while the pitches of the refection electrode 16 are expressed as $\lambda' 1 > \lambda' 2 > \ldots > \lambda' n$.

Also, the pitches $\lambda 1$ through $\lambda m$ of the reflection electrode 14 and the pitches $\lambda' 1$ through $\lambda' n$ of the reflection electrode 16 may have variation patterns with identical pitches. In this case, m is equal to n. For example, the pitch $\lambda 1$ is equal to the pitch $\lambda' 1$, $\lambda 2$ is equal to $\lambda' 2$, ... and $\lambda m$ is equal to $\lambda' n$. Alternatively, the pitches $\lambda 1$ through $\lambda m$ of the reflection electrode 14 and the pitches $\lambda' 1$ through $\lambda' n$ of the reflection electrode 16 may have variation patterns with different pitches. For example, the pitch $\lambda 1$ is not equal to the pitch $\lambda' 1$, $\lambda 2$ is not equal to $\lambda' 2$, ... and $\lambda m$ is not equal to $\lambda' n$.

The latter includes cases where the pitches of the reflection electrode 14 are only partially different from the pitches of the reflection electrode 16.

Figure 4:
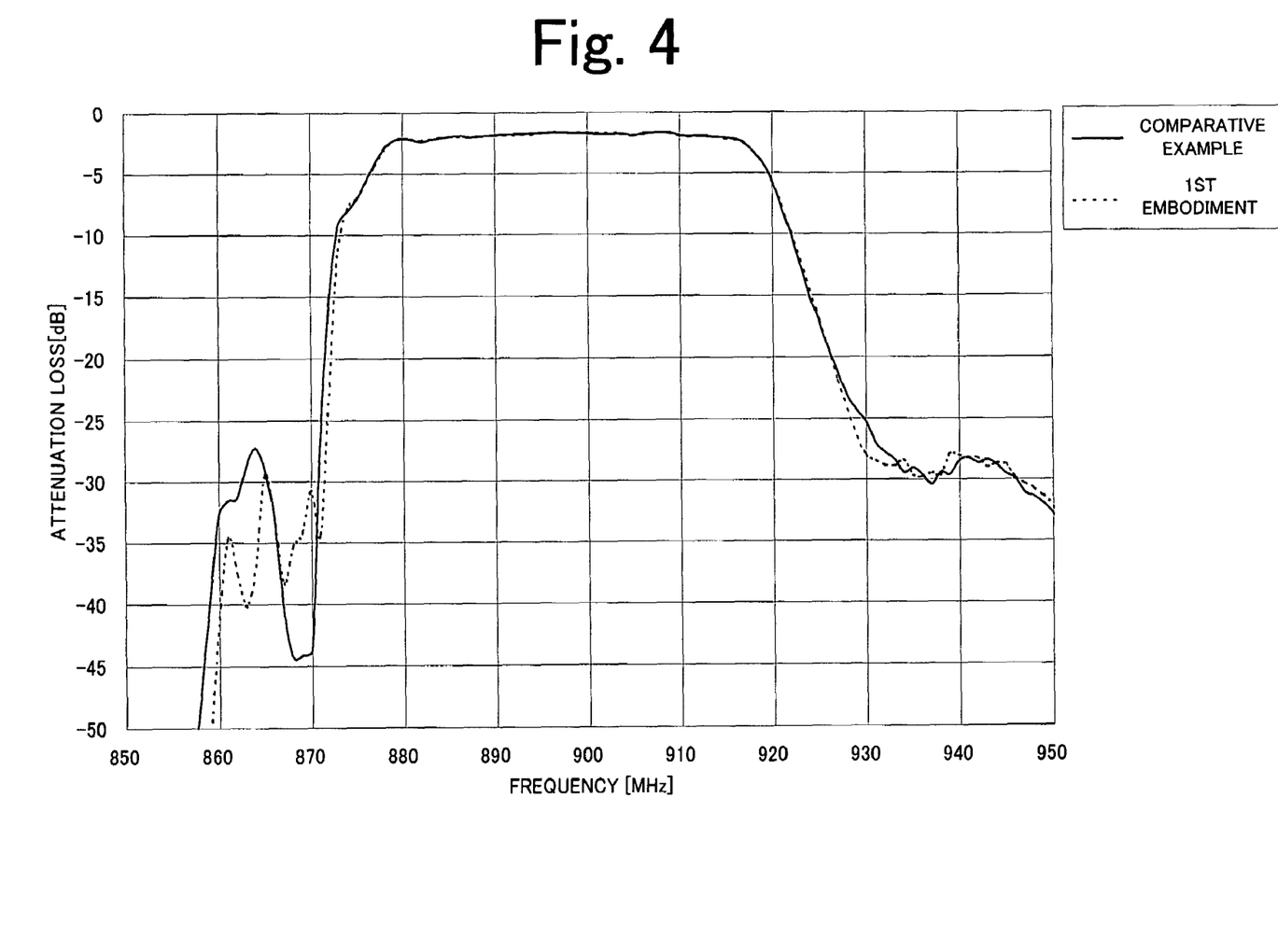
FIG. 4 shows the frequency characteristics of the first embodiment of the present invention and the comparative example.

As described above, in this embodiment, the pitches of the reflection electrodes 14 and 16 vary according to predetermined variation patterns. With this structure, the shape factor in the stop-band characteristics of the reflection electrodes 14 and 16 that greatly affect the filter characteristics can be dramatically improved, and a surface acoustic wave device (a surface acoustic wave filter) with filter characteristics that suppress spurious signals and exhibit an improved shape factor on the low frequency side of the pass band as shown in FIG. 4 can be realized. The comparative example shown in FIG. 4 is the structure with the uniform pitches λ shown in FIG. 2. The characteristics of the first embodiment described above can be obtained with any of the variation patterns described above, and may vary depending on each of the variation patterns.

(Second Embodiment)

Figure 5:
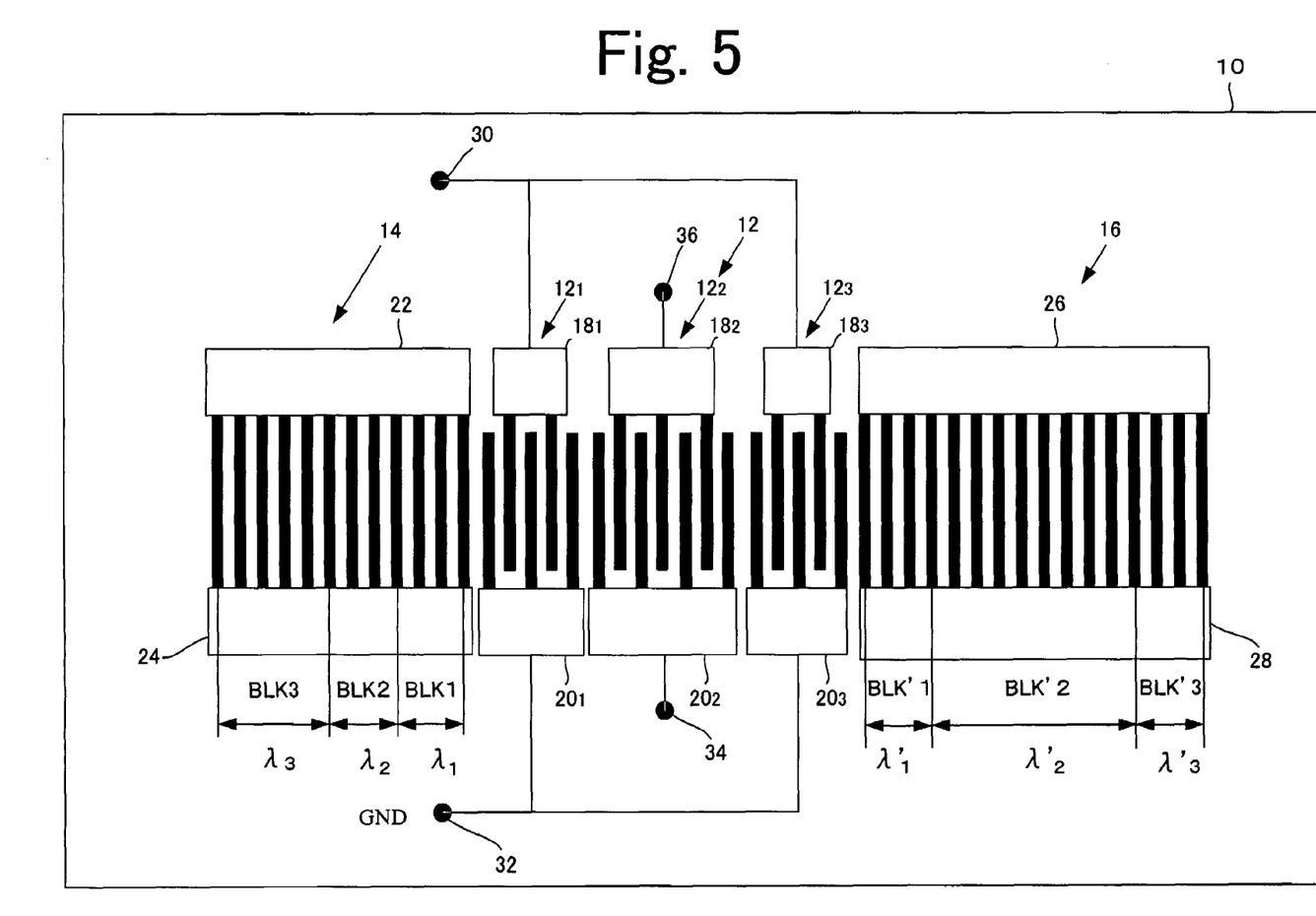
FIG. 5 illustrates a second embodiment of the present invention.

FIG. 5 illustrates a surface acoustic wave device in accordance with a second embodiment of the present invention. In FIG. 5, the same components as those described above are denoted by the same reference numerals used above.

The reflection electrode 14 shown in FIG. 5 is divided into blocks in accordance with the pitch characteristics. In the example shown in FIG. 5, the reflection electrode 14 is divided into three blocks BLK1, BLK2, and BLK3. For example, the blocks BLK1, BLK2, and BLK3 have uniform electrode pitches λ1, λ2, and λ3, respectively. The blocks BLK1, BLK2, and BLK3 may be the same or different in size (the number of electrode finger pairs contained therein). At least two of the blocks BLK1, BLK2, and BLK3 have different pitches from each other. More specifically, the relationship among the pitches is represented by one of the following expressions: $\lambda 1 \neq \lambda 2$, $\lambda 2 \neq \lambda 3$, $\lambda 1 \neq \lambda 3$, and $\lambda 1 \neq \lambda 2 \neq \lambda 3$. Likewise, the reflection electrode 16 is divided into three blocks BLK'1, BLK'2, and BLK'3. For example, the blocks BLK'1, BLK'2, and BLK'3 have uniform electrode pitches λ'1, λ'2, and λ'3, respectively. The blocks BLK'1, BLK'2, and BLK'3 may be the same or different in size (the number of electrode finger pairs contained). At least two of the blocks BLK'1, BLK'2, and BLK'3 have different pitches from each other. More specifically, the relationship among these pitches is represented by one of the following expressions: $\lambda'1 \neq \lambda'2$, $\lambda'2 \neq \lambda'3$, $\lambda'1 \neq \lambda'3$, and $\lambda'1 \neq \lambda'2 \neq \lambda'3$.

The pitches of the reflection electrodes 14 and 16 may continuously vary over the blocks. For example, the pitches of the reflection electrode 14 may be expressed as λ1<λ2<λ3 while the pitches of the refection electrode 16 may be expressed as λ'1<λ'2<λ'3. Alternatively, the pitches of the reflection electrode 14 may be expressed as λ1>λ2>λ3 while the pitches of the refection electrode 16 may be expressed as λ'1>λ'2>λ'3. In either case, the pitches λ1 through λ3 of the reflection electrode 14 and the pitches λ'1 through λ'3 of the reflection electrode 16 may either linearly or non-linearly vary. In the case of linear variation, the pitches either monotonously increase or monotonously decrease. The pitches may also increase halfway and then decrease. In the case of non-linear variation, the pitches curvilinearly vary. For example, the variation pattern of the pitches λ1 through λ3 of the reflection electrode 14 and the variation pattern of the pitches λ'1 through λ'3 of the reflection electrode 16 may be each represented by a sine curve, a cosine curve, or the like, or a quadratic curve.

Alternatively, the variation pattern of the pitches λ1 through λ3 of the reflection electrode 14 and the variation pattern of the pitches λ'1 through λ'3 of the reflection electrode 16 may each have a peak in the middle of each corresponding reflection electrode. For example, the electrode pitch λ2 of the block BLK2 of the reflection electrode 14 may be larger or smaller than the other pitches λ1 and λ3. Likewise, the electrode pitch λ'2 of the block BLK'2 of the reflection electrode 16 may be larger or smaller than the other pitches λ'1 and λ'3. Further, the variation pattern of the pitches of the blocks BLK1 through BLK3 of the reflection electrode 14 and the variation pattern of the pitches of the blocks BLK'1 through BLK'3 of the reflection electrode 16 may be either symmetrical or asymmetrical with respect to the drive electrode 12. In the case of symmetrical variation, the pitches of the reflection electrode 14 are expressed as λ1<λ2<λ3 while the pitches of the refection electrode 16 are expressed as λ'1<λ'2<λ'3. If the number of blocks of the reflection electrode 14 is different from the number of blocks of the reflection electrode 16, the variation patterns cannot be completely symmetrical. However, as large as the tendency of variation is the same between the reflection electrodes 14 and 16, the variation patterns are considered to be symmetrical. In the case of asymmetrical variation, the pitches of the reflection electrode 14 are expressed as λ1<λ2<λ3 while the pitches of the refection electrode 16 are expressed as λ'1>λ'2>λ'3. Asymmetrical variation pattern may represent a case where each of the blocks is different from one another in size. The size of a block is the number of electrode finger pairs contained in the block, for example. In FIG. 5, the blocks BLK1 through BLK3 and the blocks BLK'1 through BLK'3 are different from one another in size. However, only a few of the blocks BLK1 through BLK3 and the blocks BLK'1 through BLK'3 may be different from the others.

Also, the pitches λ1 through λ3 of the reflection electrode 14 and the pitches λ'1 through λ'3 of the reflection electrode 16 may have variation patterns with identical pitches. For example, the pitch λ1 is equal to the pitch λ'1, λ2 is equal to λ'2, and λ3 is equal to λ'3. Alternatively, the pitches λ1 through λ3 of the reflection electrode 14 and the pitches λ'1 through λ'3 of the reflection electrode 16 may have variation patterns with different pitches. For example, the pitch λ1 is not equal to the pitch λ'1, and/or λ2 is not equal to λ40 2, and/or λ3 is not equal to λ'3. Further, the pitch λ3 of the outermost block BLK3 of the blocks BLK1 through BLK3 of the reflection electrode 14 may be the largest or the smallest. Likewise, the pitch λ'3 of the outermost block BLK'3 of the blocks BLK'1 through BLK'3 of the reflection electrode 16 may be the largest or the smallest.

Figure 6:
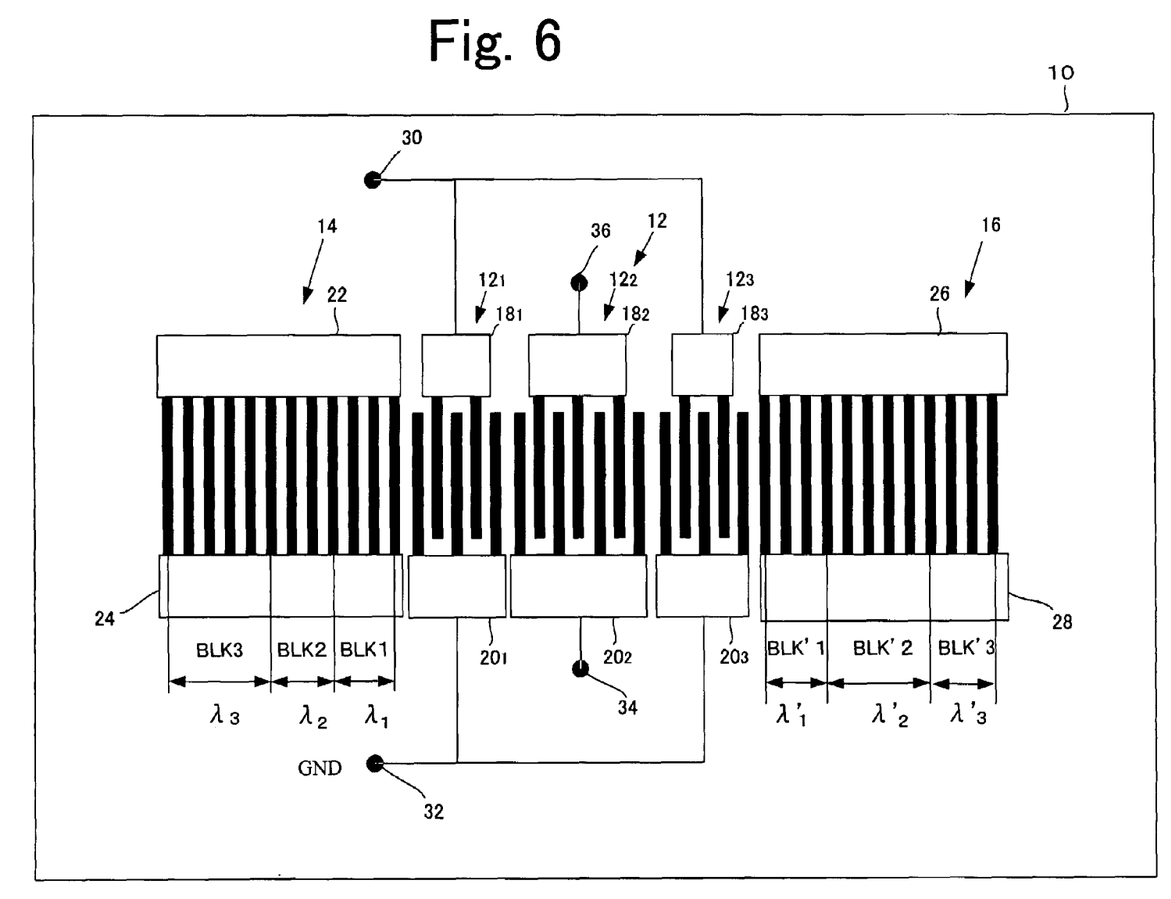
FIG. 6 illustrates another example structure of the second embodiment of the present invention.

Although the reflection electrodes 14 and 16 have different numbers of electrode finger pairs in FIG. 5, the same principles as described above are applied to the reflection electrodes 14 and 16 having the same numbers of electrode finger pairs as shown in FIG. 6. Also, the number of blocks is not limited to three, but may be two or more than three. The reflection electrodes 14 and 16 with the greatest possible blocks are the reflection electrodes 14 and 16 of the first embodiment. Although each block of the blocks BLK1 through BLK 3 and the block BLK'1 through BLK'3 in FIGS. 5 and 6 has uniform electrode finger pitches, the pitches of some of the blocks may continuously vary. Each of the reflection electrodes 14 and 16 may have blocks with uniform pitches and blocks with continuously varying pitches.

As described above, in this embodiment, the pitches of the reflection electrodes 14 and 16 vary over the blocks. With this structure, the shape factor in the stop-band characteristics of the reflection electrodes 14 and 16 that greatly affect the filter characteristics can be dramatically improved, and a surface acoustic wave device (a surface acoustic wave filter) with filter characteristics that suppress spurious signals and exhibit an improved shape factor on the low frequency side of the pass band as shown in FIG. 4 can be realized.

(Third Embodiment)

Figure 7A:
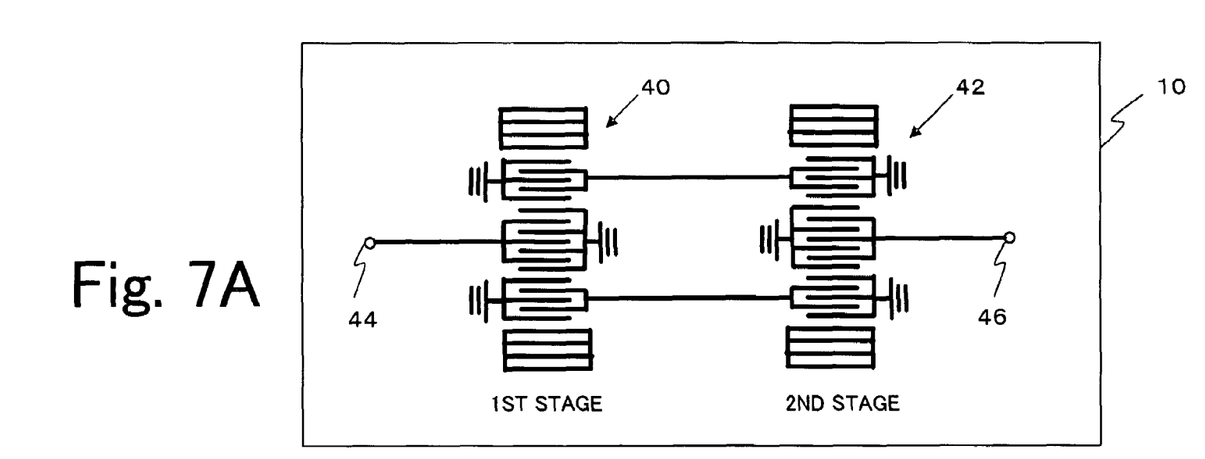
FIGS. 7A and 7B illustrate a third embodiment of the present invention.
Figure 7B:
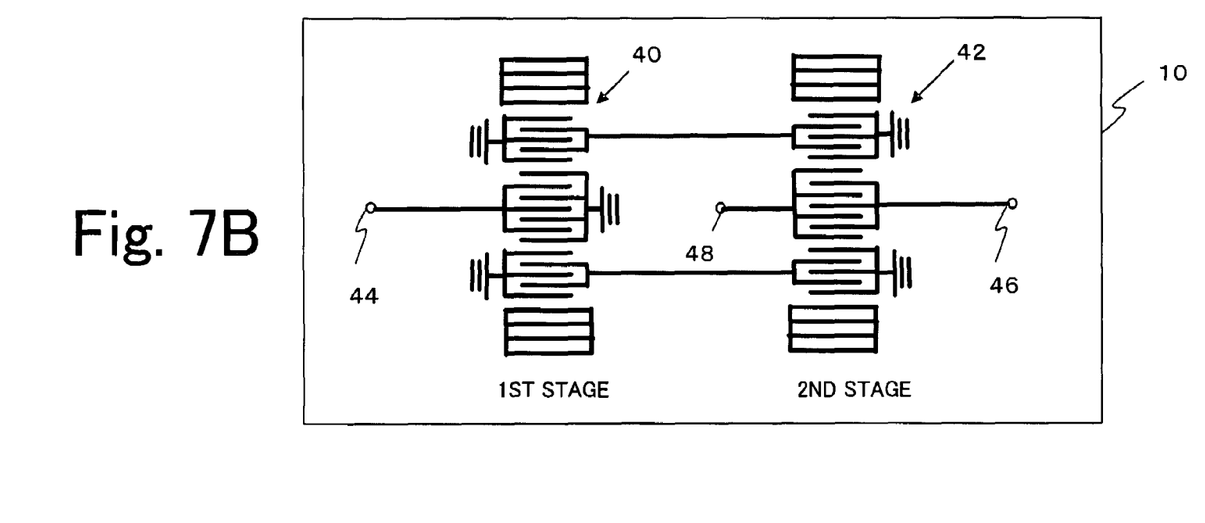

FIGS. 7A and 7B illustrate a surface acoustic wave device in accordance with a third embodiment of the present invention. The surface acoustic wave device shown in FIG. 7A is of a regular output type, and the surface acoustic wave device shown in FIG. 7B is of a balanced output type. In each of the surface acoustic wave devices shown in FIGS. 7A and 7B, two resonators 40 and 42 (hereinafter referred to as the first and second resonators 40 and 42) are cascade-connected to each other. The surface acoustic wave device shown in FIG. 7A includes an input terminal 44 and an unbalanced output terminal 46. The surface acoustic wave device shown in FIG. 7B includes an input terminal 44 and balanced output terminals 46 and 48. In this structure, the input terminal 44 may be of a balanced type, instead of the output terminals 46 and 48, or the input terminal 44 and the output terminals 46 and 48 may be of balanced types.

Each of the first and second resonators 40 and 42 has the features of the present invention, and is formed with one of the surface acoustic wave devices of the first and second embodiments. More specifically, in each of the first and second resonators 40 and 42, pitches of the reflection electrodes vary according to a predetermined variation pattern. In each of the first and second resonators 40 and 42, the variation patterns of the pair or reflection electrodes may be the same or different from each other. Also, in each of the first and second resonators 40 and 42, pitches in the pair of reflection electrodes may be either identical to or different from each other.

Also, the electrode pitch variation pattern of the first resonator 40 and the electrode pitch variation pattern of the second resonator 42 may be completely different from each other, may be the same as each other, or may be partially the same as each other. "Being partially the same as each other" means that the reflection electrodes 14 of the first and second resonators 40 and 42 have the same variation patterns while the reflection electrodes 16 of the first and second resonators 40 and 42 have different variation patterns, for example. This also includes a case where the reflection electrodes 14 of the first and second resonators 40 and 42 are partially the same (or different). When this is applied to the second embodiment, the blocks BLK1 and the BLK'1 of the reflection electrodes 14 of the first and second resonators 40 and 42 have different pitches, but the blocks BLK2 and BLK'2 and the blocks BLK3 and BLK'3 have the same pitches.

As surface acoustic wave devices of the first or second embodiment that can achieve the above described effects are cascade-connected, this embodiment can provide a surface acoustic wave device with such filter characteristics that suppressed spurious signals more effectively and exhibit an even further improved shape factor (the sharpness at the cut-off region of the pass band) on the low frequency side of the pass band of the resonators.

Even with a cascade connection structure with three or more stages, the reflection electrodes 14 and 16 can be designed in the same manner as in the case of the two-stage structure. Furthermore, in a case where two or more resonators are connected in parallel and then cascade-connected, the reflection electrodes 14 and 16 can be designed in the same manner as in the case of the two-stage structure.

EXAMPLE 1

Example 1 is a surface acoustic wave device of the second embodiment in which each of the reflection electrodes 14 and 16 is divided into three blocks. In this example, the number of electrode finger pairs in each of the blocks BLK1 and BLK'1 is 2, the number of electrode finger pairs in each of the blocks BLK2 and BLK'2 is 25, and the number of electrode finger pairs in each of the blocks BLK3 and BLK'3 is 24. The wavelengths $\lambda 1$ and $\lambda'1$ of the blocks BLK1 and BLK'1 are both 4.525 $\mu$m ($\lambda 1=\lambda'1$), the wavelengths $\lambda 3$ and $\lambda'3$ of the blocks BLK3 and BLK'3 are both 4.525 $\mu$m ($=\lambda 1=\lambda'1$), and the wavelengths $\lambda 2$ and $\lambda'2$ ($=\lambda 2$) of the blocks BLK2 and BLK'2 are 4.515 $\mu$m, 4.510 $\mu$m, and 4.505 $\mu$m. The piezoelectric substrate 10 is made of $LiTaO_3$, and the drive electrode 12 and the reflection electrodes 14 and 16 contain aluminum as a main component.

Figure 8:
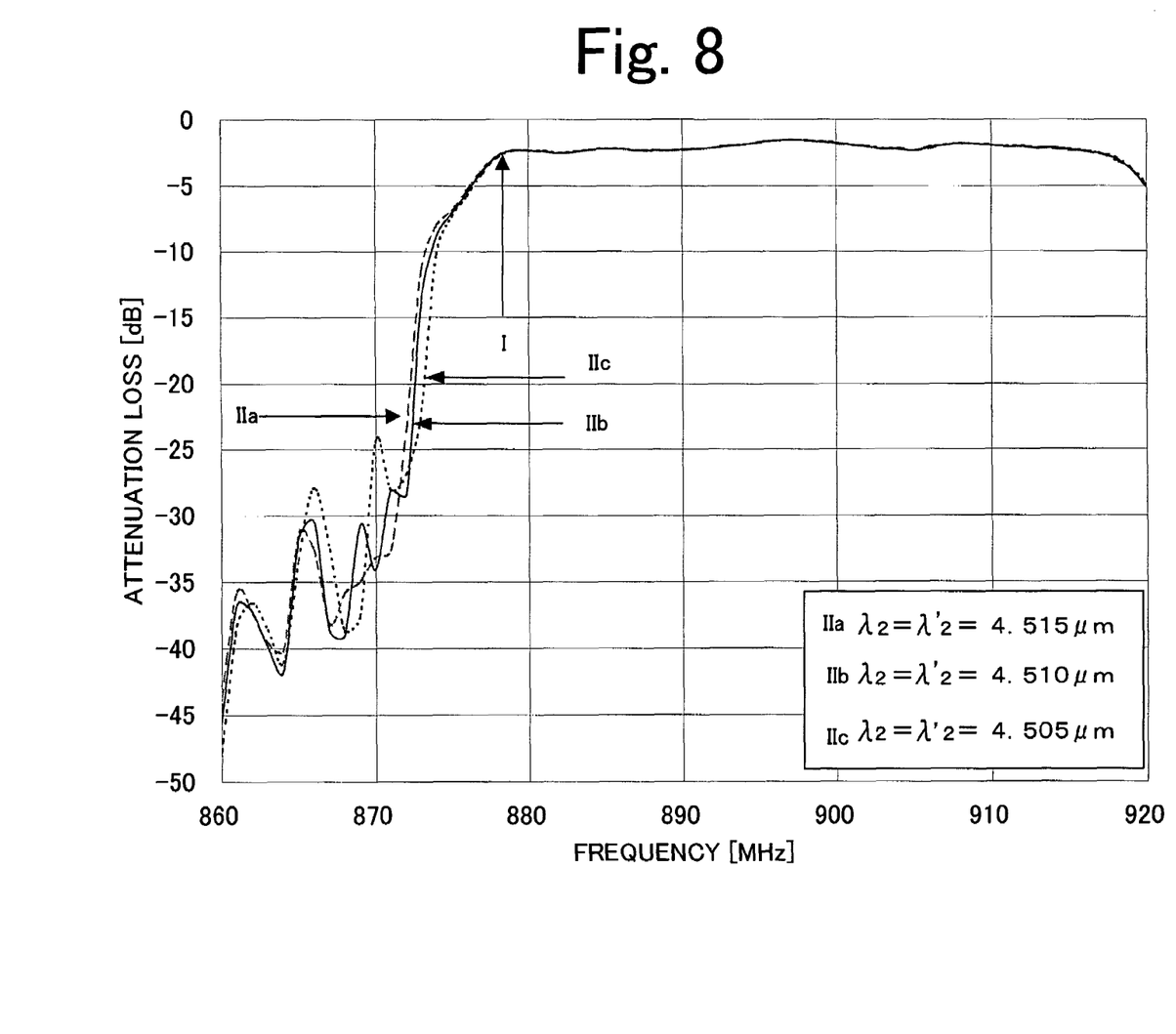
FIG. 8 shows the frequency characteristics of Example 1 of the present invention.

FIG. 8 shows the frequency characteristics of Example 1. As can be seen from FIG. 8, the peak point (denoted by I in FIG. 8) of the pass band does not change even though the pitches $\lambda 2$ and $\lambda'2$ are varied. However, as the pitches $\lambda 2$ and $\lambda'2$ are shortened from 4.515 $\mu$m (IIa) to 4.510 $\mu$m (IIb) to 4.505 $\mu$m (IIc), the shape factor is improved. Accordingly, Example 1 provides a surface acoustic wave device with a great degree of suppression on spurious signals and an improved shape factor on the low frequency side of the pass band.

EXAMPLE 2

Example 2 is a surface acoustic wave device of the second embodiment in which each of the reflection electrodes 14 and 16 is divided into three blocks. In this example, the number of electrode finger pairs in each of the blocks BLK1 and BLK'1 is 2, the number of electrode finger pairs in each of the blocks BLK2 and BLK'2 is 25, and the number of electrode finger pairs in each of the blocks BLK3 and BLK'3 is 24. The wavelengths $\lambda 1$ and $\lambda'1$ of the blocks BLK1 and BLK'1 are both 4.27 $\mu$m ($\lambda 1=\lambda'1$), the wavelengths $\lambda 2$ and $\lambda'2$ of the blocks BLK2 and BLK'2 are both 4.28 $\mu$m ($\lambda 2=\lambda'2$), and the wavelengths $\lambda 3$ and $\lambda'3$ of the blocks BLK3 and BLK'3 are both 4.29 $\mu$m ($\lambda 3=\lambda'3$). In this example, each of the three electrodes $12_1$, $12_2$, and $12_3$ of the drive electrode 12 is also divided into three blocks with varied pitches. In the blocks of the electrode $12_1$, the numbers of electrode finger pairs are 12, 1, and 1.5, and the pitches are 4.21 $\mu$m, 4.08 $\mu$m, and 3.79 $\mu$m, seen from the left in FIG. 5. In the blocks of the electrode $12_2$, the numbers of electrode finger pairs are 1.5, 14, and 1.5, and the pitches are 3.95 $\mu$m, 4.22 $\mu$m, and 3.95 $\mu$m, seen from the left in FIG. 5. In the blocks of the electrode $12_3$, the numbers of electrode finger pairs are 1.5, 1, and 12, and the pitches are 3.79 $\mu$m, 4.08 $\mu$m, and 4.21 $\mu$m, seen from the left in FIG. 5. The piezoelectric substrate 10 is made of $LiTaO_3$, and the drive electrode 12 and the reflection electrodes 14 and 16 contain aluminum as a main component.

Figure 9:
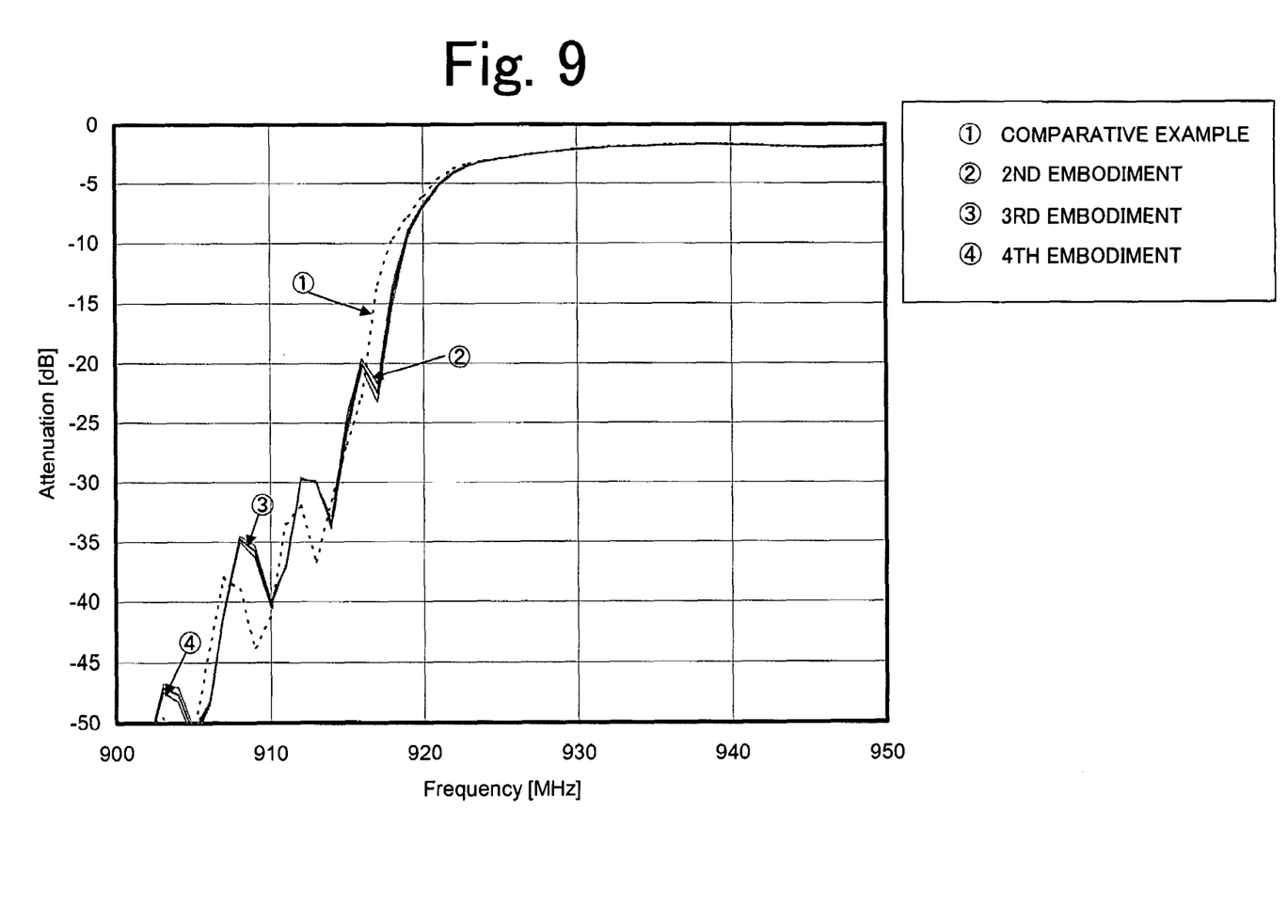
FIG. 9 shows the characteristics of Examples 2 through 4 of the present invention, and the characteristics of a comparative example.

FIG. 9 shows the frequency characteristics of Example 2. FIG. 9 also shows the frequency characteristics of a surface acoustic wave device with the structure shown in FIG. 2 as a comparative example. The pitches $\lambda$ of the reflection electrodes 14A and 16A of the comparative example are uniform at 4.29 $\mu$m. Compared with the comparative example, Example 2 suppresses spurious signals more effectively and has a better shape factor on the low frequency side of the pass band, as shown in FIG. 9.

(Third Embodiment)

Example 3 is a surface acoustic wave device of the second embodiment in which each of the reflection electrodes 14 and 16 is divided into three blocks. In this example, the number of electrode finger pairs in each of the blocks BLK1 and BLK'1 is 2, the number of electrode finger pairs in each of the blocks BLK2 and BLK'2 is 25, and the number of electrode finger pairs in each of the blocks BLK3 and BLK'3 is 24. The wavelengths λ1 and λ'1 of the blocks BLK1 and BLK'1 are both 4.28 μm (λ1=λ'1), the wavelengths λ2 and λ'2 of the blocks BLK2 and BLK'2 are both 4.28 μm (λ2=λ'2), and the wavelengths λ3 and λ'3 of the blocks BLK3 and BLK'3 are both 4.29 μm (λ3=λ'3). As the wavelengths λ1, λ'1, λ2, and λ'2 are all 4.28 μm, each of the reflection electrodes 14 and 16 is actually divided into two. In this example, each of the three electrodes $12_1$, $12_2$, and $12_3$ of the drive electrode 12 is also divided into three blocks with varied pitches. In the blocks of the electrode $12_1$, the numbers of electrode finger pairs are 12, 1, and 1.5, and the pitches are 4.21 μm, 4.08 μm, and 3.79 μm, seen from the left in FIG. 5. In the blocks of the electrode $12_2$, the numbers of electrode finger pairs are 1.5, 14, and 1.5, and the pitches are 3.95 μm, 4.22 μm, and 3.95 μm, seen from the left in FIG. 5. In the blocks of the electrode $12_3$, the numbers of electrode finger pairs are 1.5, 1, and 12, and the pitches are 3.79 μm, 4.08 μm, and 4.21 μm, seen from the left in FIG. 5. The piezoelectric substrate 10 is made of $LiTaO_3$, and the drive electrode 12 and the reflection electrodes 14 and 16 contain aluminum as a main component.

FIG. 9 shows the frequency characteristics of Example 3. Compared with the comparative example, Example 3 suppresses spurious signals more effectively and exhibits a better shape factor on the low frequency side of the pass band, as shown in FIG. 9.

EXAMPLE 4

Example 4 is a surface acoustic wave device of the second embodiment in which each of the reflection electrodes 14 and 16 is divided into three blocks. In this example, the number of electrode finger pairs in each of the blocks BLK1 and BLK'1 is 2, the number of electrode finger pairs in each of the blocks BLK2 and BLK'2 is 25, and the number of electrode finger pairs in each of the blocks BLK3 and BLK'3 is 24. The wavelengths λ1 and λ'1 of the blocks BLK1 and BLK'1 are both 4.29 μm (λ1=λ'1), the wavelengths λ2 and λ'2 of the blocks BLK2 and BLK'2 are both 4.28 μm (λ2=λ'2), and the wavelengths λ3 and λ'3 of the blocks BLK3 and BLK'3 are both 4.29 μm (λ3=λ'3). In this example, each of the three electrodes $12_1$, $12_2$, and $12_3$ of the drive electrode 12 is also divided into three blocks with varied pitches. In the blocks of the electrode $12_1$, the numbers of electrode finger pairs are 12, 1, and 1.5, and the pitches are 4.21 μm, 4.08 μm, and 3.79 μm, seen from the left in FIG. 5. In the blocks of the electrode $12_2$, the numbers of electrode finger pairs are 1.5, 14, and 1.5, and the pitches are 3.95 μm, 4.22 μm, and 3.95 μm, seen from the left in FIG. 5. In the blocks of the electrode $12_3$, the numbers of electrode finger pairs are 1.5, 1, and 12, and the pitches are 3.79 μm, 4.08 μm, and 4.21 μm, seen from the left in FIG. 5. The piezoelectric substrate 10 is made of $LiTaO_3$, and the drive electrode 12 and the reflection electrodes 14 and 16 contain aluminum as a main component.

FIG. 9 shows the frequency characteristics of Example 4. Compared with the comparative example, Example 4 suppresses spurious signals more effectively and exhibits a better shape factor on the low frequency side of the pass band, as shown in FIG. 9.

When the piezoelectric substrate 10 is made of $LiNbO_3$ in any of Examples 1 through 4, the same effects as above can be achieved.

The present invention has been described so far by way of embodiments and examples. However, the present invention is not limited to the above described embodiments and examples, and various modification and changes may be made.

As described so far, the present invention can provide a surface acoustic wave device with a greater degree of suppression on spurious signals and a better shape factor (the sharpness at the cut-off region of the pass band). The surface acoustic wave device of the present invention can be used as a filter of a high-frequency circuit in a wireless device.

What is claimed is:

1. A surface acoustic wave device comprising:
   a substrate;
   a pair of reflection electrodes formed on the substrate; and
   a plurality of drive electrodes interposed between the pair of reflection electrodes,
   each of the reflection electrodes having pitches that vary according to a respective given variation pattern, and
   wherein each of the reflection electrodes has a variation pattern that exhibits a peak in the middle of a corresponding one of the reflection electrodes.

2. A surface acoustic wave device comprising:
   a pair of reflection electrodes formed on a substrate; and
   a plurality of drive electrodes interposed between the pair of reflection electrodes,
   each of the reflection electrodes being divided into blocks, and
   at least two of the blocks having different pitches from each other,
   wherein the block located in the middle of the plurality of blocks in each of the reflection electrodes has the largest or smallest pitch.

3. The surface acoustic wave device as claimed in claim 1, wherein the pitches in each of the reflection electrodes continuously vary therein.

4. The surface acoustic wave device as claimed in claim 1, wherein the pitches in each of the reflection electrodes linearly vary.

5. The surface acoustic wave device as claimed in claim 1, wherein the pitches in each of the reflection electrodes non-linearly vary.

6. The surface acoustic wave device as claimed in claim 1, wherein the pitches in each of the reflection electrodes curvilinearly vary.

7. The surface acoustic wave device as claimed in claim 1, wherein the reflection electrodes have different variation patterns.

8. The surface acoustic wave device as claimed in claim 1, wherein the reflection electrodes have variation patterns that are symmetrical with respect to the plurality of drive electrodes.

9. The surface acoustic wave device as claimed in claim 1, wherein the reflection electrodes have variation patterns that are asymmetrical with respect to the plurality of drive electrodes.

10. The surface acoustic wave device as claimed in claim 1, wherein the reflection electrodes have identical variation patterns.

11. The surface acoustic wave device as claimed in claim 2, wherein the outermost block of the plurality of blocks in each of the reflection electrodes has the largest or smallest pitch.

12. The surface acoustic wave device as claimed in claim 2, wherein each two neighboring blocks in each of the reflection electrodes have different pitches from each other.

13. The surface acoustic wave device as claimed in claim 2, wherein the blocks in each of the reflection electrodes have different pitches from one another.

14. The surface acoustic wave device as claimed in claim 2, wherein the pitches in each of the reflection electrodes continuously vary over the plurality of blocks.

15. The surface acoustic wave device as claimed in claim 2, wherein the pitches in each of the reflection electrodes linearly vary over the plurality of blocks.

16. The surface acoustic wave device as claimed in claim 2, wherein the pitches in each of the reflection electrodes non-linearly vary over the plurality of blocks.

17. The surface acoustic wave device as claimed in claim 2, wherein a variation pattern of the pitches over the plurality of blocks in each of the reflection electrodes is symmetrical with respect to a corresponding one of the drive electrodes.

18. The surface acoustic wave device as claimed in claim 2, wherein a variation pattern of the pitches over the plurality of blocks in each of the reflection electrodes is asymmetrical with respect to a corresponding one of the plurality of drive electrodes.

19. The surface acoustic wave device as claimed in any of claims 2, 12–18 and 11, wherein the pitches in each of the blocks are uniform.

20. The surface acoustic wave device as claimed in any of claims 1–6 and 7–10, 12–18, wherein each of the reflection electrodes has respective different pitches.

21. The surface acoustic wave device as claimed in any of claims 1–6, 8, 10 and 12–17, wherein each of the reflection electrodes has identical pitches.

22. A surface acoustic wave device that has longitudinally coupled multi-mode resonators, each of the resonators comprising:
  a pair of reflection electrodes that are formed on a substrate;
  a plurality of drive electrodes interposed between the pair of reflection electrodes,
  each of the reflection electrodes having pitches that vary according to a predetermined given variation pattern,
  wherein a first resonator of the resonators has a different variation pattern from that of a second resonator of the resonators.

23. The surface acoustic wave device as claimed in claim 22, wherein a first resonator of the resonators has a pitch of a reflection electrode different from that of a reflection electrode of a second resonator of the resonators.

24. The surface acoustic wave device as claimed in either of claims 22 or 23, wherein at least one of an input terminal or an output terminal is of a balanced type.

\* \* \* \* \*